United States Patent
Yamada et al.

(10) Patent No.: US 7,314,388 B2
(45) Date of Patent: Jan. 1, 2008

(54) ADAPTER, MEMORY CARD, AND MEMORY CARD MODULE

(75) Inventors: Hiroyuki Yamada, Osaka (JP); Masayoshi Yano, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 75 days.

(21) Appl. No.: 10/494,191

(22) PCT Filed: Oct. 14, 2003

(86) PCT No.: PCT/JP03/13140

§ 371 (c)(1),
(2), (4) Date: Oct. 13, 2004

(87) PCT Pub. No.: WO2004/036491

PCT Pub. Date: Apr. 29, 2004

(65) Prior Publication Data

US 2005/0037671 A1     Feb. 17, 2005

(30) Foreign Application Priority Data

Oct. 15, 2002  (JP) ............................. 2002-300098

(51) Int. Cl.
*H01R 24/00* (2006.01)

(52) U.S. Cl. ............... 439/630; 439/325; 439/945; 361/737

(58) Field of Classification Search ........ 439/630–632, 439/325, 945; 361/737
See application file for complete search history.

(56) References Cited

U.S. PATENT DOCUMENTS

| 4,969,060 | A | * | 11/1990 | O'Neill | 360/133 |
| 5,155,663 | A | * | 10/1992 | Harase | 361/684 |
| 5,584,043 | A | * | 12/1996 | Burkart | 710/62 |
| 6,122,175 | A | * | 9/2000 | Shieh | 361/737 |
| 6,149,450 | A | * | 11/2000 | Gastineau | 439/325 |
| 6,189,055 | B1 | * | 2/2001 | Eisele et al. | 710/62 |

(Continued)

FOREIGN PATENT DOCUMENTS

CN       1340226       3/2002

(Continued)

OTHER PUBLICATIONS

Reference attachment 1.*

(Continued)

*Primary Examiner*—Truc Nguyen
(74) *Attorney, Agent, or Firm*—RatnerPrestia

(57) ABSTRACT

An adapter to be attached to a memory card for changing an external shape such that it can be inserted into a memory card insertion section of specific type equipment is provided. The adapter includes: an adapter body for defining a space housing the memory card; a write protect mechanism including a write enable/disable setting member which is slidable with respect to the adapter body; and a terminal portion located in the adapter body, which is formed so as to be electrically connected to a terminal portion of the memory card when the memory card is housed in the adapter body, and in which the write protect mechanism sets whether to enable or disable writing of data into the memory card in accordance with the position of the write enable/disable setting member.

12 Claims, 11 Drawing Sheets

U.S. PATENT DOCUMENTS

| | | | |
|---|---|---|---|
| 6,219,256 B1 * | 4/2001 | Wu | 361/801 |
| 6,224,391 B1 * | 5/2001 | Horie et al. | 439/64 |
| 6,524,137 B1 * | 2/2003 | Liu et al. | 439/638 |
| 6,709,281 B2 * | 3/2004 | Shishikura et al. | 439/188 |
| 7,189,118 B2 * | 3/2007 | Lee | 439/630 |

FOREIGN PATENT DOCUMENTS

| | | |
|---|---|---|
| JP | 07-085628 A | 3/1995 |
| JP | 2001-134730 A | 5/2001 |
| JP | 2001-256466 A | 9/2001 |
| JP | 2002-032715 A | 1/2002 |

OTHER PUBLICATIONS

Japanese translation of International Search Report for PCT/JP03/13140, dated Jan. 20, 2004.

English translation of PCT/ISA/210.

* cited by examiner

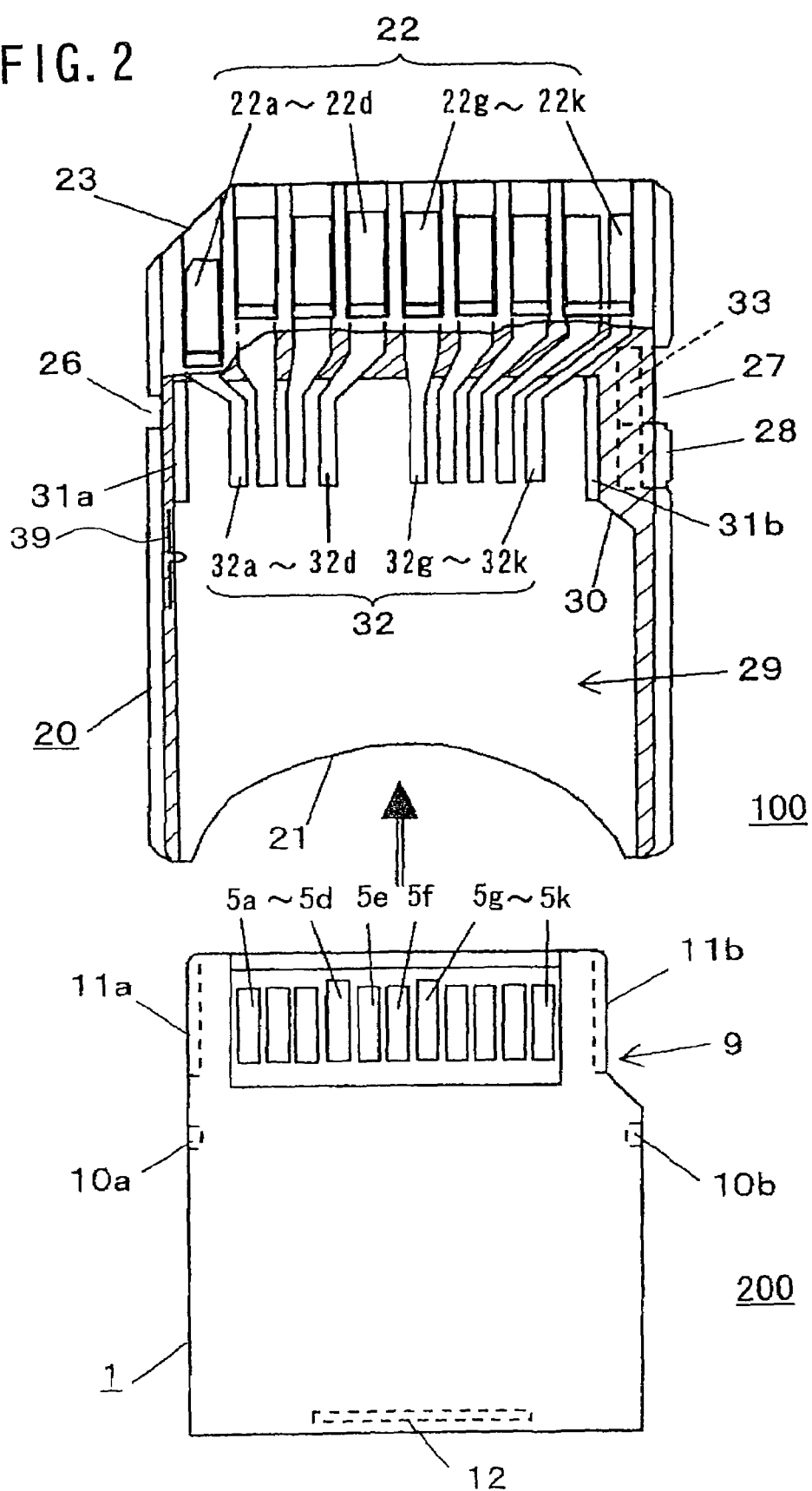

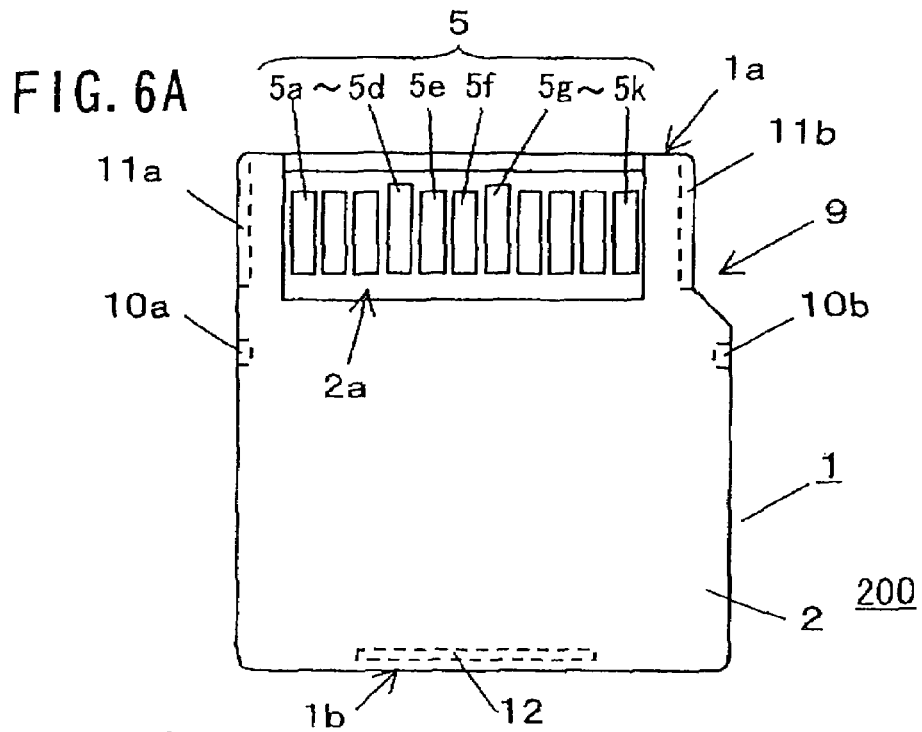
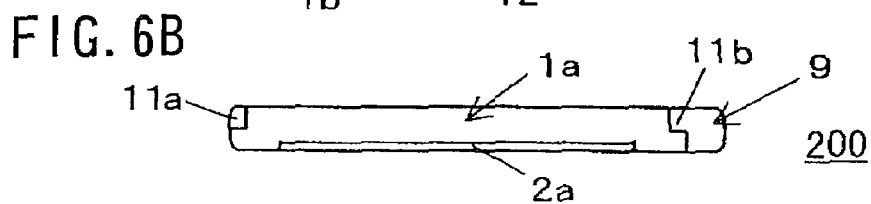
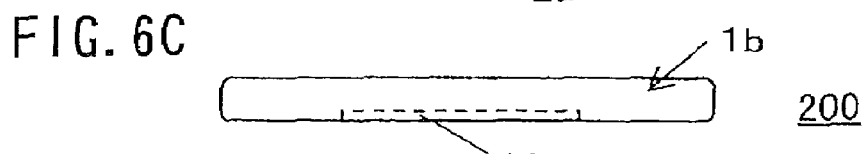
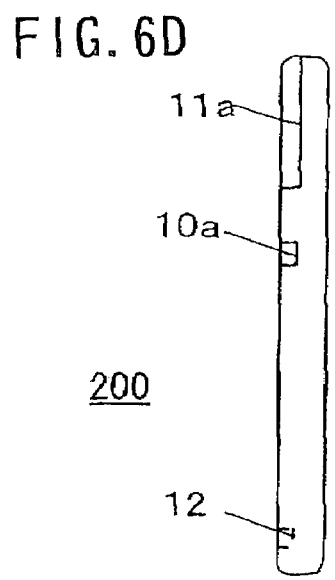
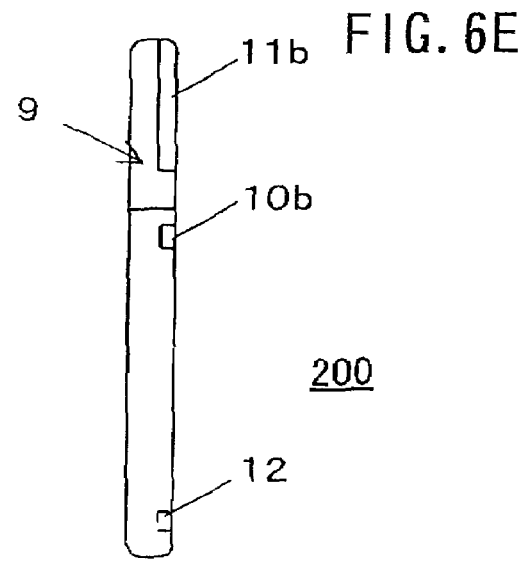

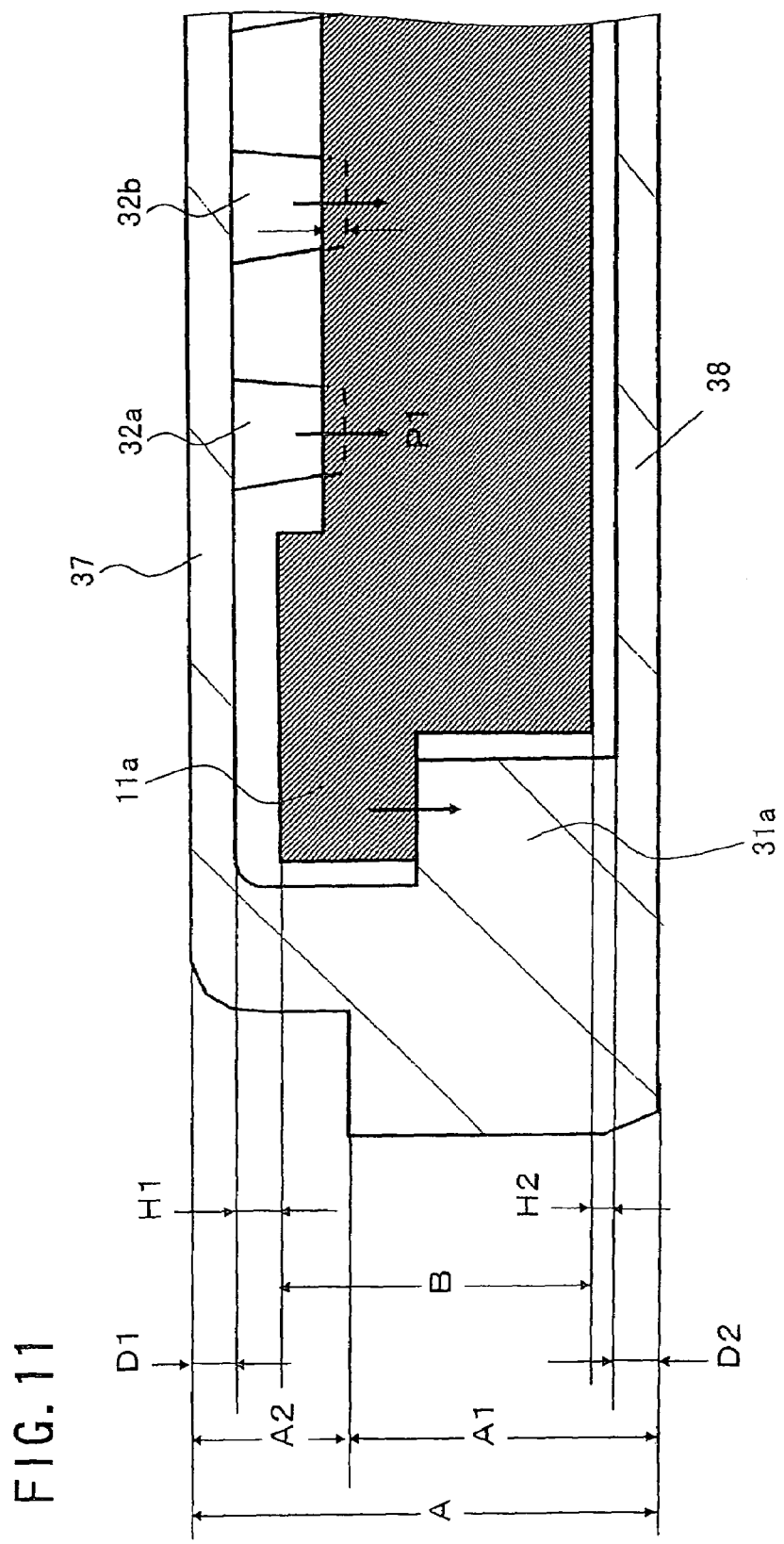

ND MEMORY# ADAPTER, MEMORY CARD, AND MEMORY CARD MODULE

THIS APPLICATION IS A U.S. NATIONAL PHASE APPLICATION OF PCT INTERNATIONAL APPLICATION PCT/JP03/13140.

TECHNICAL FIELD

The present invention relates to an adapter to be attached to a memory card for changing the external shape such that it can be inserted into a memory card insertion section of specific type equipment, a memory card structured enabling it to be housed in the adapter, and a memory card module including the memory card and the adapter.

BACKGROUND ART

Recently, a small and light memory card incorporating a semiconductor memory has been developed. A memory card has various sizes. For example, an SD memory card which has been recently developed has a size of a stamp (for example, see Japanese Laid-Open Publication No. 2001-134730).

FIG. 12 shows a structure of a conventional memory card 400. The memory card 400 may be, for example, an SD memory card.

The memory card 400 includes a memory card body 41, a contact terminal 42, and a write enable/disable setting member 50 included in a write protect mechanism.

The memory card body 41 incorporates a printed circuit board and a semiconductor memory. The semiconductor memory is provided on the printed circuit board. On a side surface of the memory card body 41, a notch portion 43 is formed. The notch portion 43 is formed, so that the memory card 400 is prevented from being erroneously inserted into a memory card insertion section of specific type equipment.

In the memory card body 41, a projecting portion 44, step portions 45, a rib portion 46, recessed portion 48, and a notch portion 49 are further formed.

The projecting portion 44 has a width slightly smaller than the memory card body 41 and has a thickness greater than the memory card body 41. The step portions 45 are formed on side surfaces on both sides of the memory card body 41. Each of the step portions 45 has thickness D. The step portions 45 are formed so as to fit onto step portions formed inside a memory card insertion section of specific type equipment. When the memory card 400 is inserted into a memory card insertion section of specific type equipment, the step portions 45 are guided with step portions formed inside a memory card insertion section of specific type equipment. In the rib portion 46, a plurality of projecting portions are formed.

The recessed portion 48 is formed on a side surface on one side of the memory card body 41 enabling it to fit onto a projecting portion formed inside a memory card insertion section of specific type equipment. Since the recessed portion 48 fits onto the projecting portion, the memory card 400 is prevented from being easily detached from the memory card insertion section of the specific type equipment.

The notch portion 49 is formed on a side surface on one side of the memory card body 41. The notch portion 49 is formed on the side surface opposite to the side surface having the recessed portion 48 formed thereon.

The write enable/disable setting member 50 is fitted into the notch portion 49 so as to be slidable with respect to the memory card body 41. The write enable/disable setting member 50 is arranged such that it is selected to be in either the first position or the second position. At the first position, a part of the write enable/disable setting member 50 covers a part of the notch portion 49. At the second position, a part of the write enable/disable setting member 50 covers the other part of the notch portion 49. The write protect mechanism sets whether to enable or disable writing of data into the semiconductor memory in accordance with the position of the write enable/disable setting member 50. The write protect mechanism can mechanically set whether to enable or disable writing of data into the memory card in accordance with the position of the write enable/disable setting member 50. The external shape of the write enable/disable setting member 50 is formed substantially integral to the external shape of the memory card body 41.

The contact terminal 42 is located on the printed circuit board incorporated in the memory card body 41 and electrically connected to the semiconductor memory. The contact terminal 42 is formed so as to be electrically connected to a terminal portion of specific type equipment when the memory card 400 is inserted into a memory card insertion section of the specific type equipment. The contact terminal 42 is exposed to the outside of the memory card 400 from spaces between the plurality of projecting portions formed in the rib portion 46.

Recent enhancement in integration and density of a semiconductor memory enables implementation of a memory card which has a smaller size and a higher capacity compared to the conventional SD memory card and which is adapted for multifunction. For example, a mini SD memory card which is smaller than the conventional SD memory card has been implemented.

In the case where a memory card is miniaturized, compatibility with other memory cards having different shapes becomes a problem. In order to address the problem of compatibility, various adapters have been proposed (see, for example, Japanese Laid-Open Publication Nos. 2000-214970, 2001-297307, and 2001-101356). For example, one type of adapter attaches to a memory card for changing the external shape such that it can be inserted into a memory insertion section of equipment adapted to a conventional SD memory card.

On a side surface of a conventional SD memory card, a write protect mechanism is provided. On a side surface of a SD memory card module including a mini SD memory card and an adapter, a write protect mechanism must also be provided. However, a mini SD memory card should be thin, and should also have a small area. Thus, a write protect mechanism cannot be provided in a mini SD card. If a write protect mechanism is provided in an adapter, there may be a restriction in shape of the memory card to be housed in the adapter body.

The objective of the present invention is to provide an adapter to be attached to a memory card for changing the external shape without electrically setting whether to enable or disable writing of data into the memory card, a memory card structured enabling it to be housed in the adapter, and a memory card module including the memory card and the adapter.

DISCLOSURE OF THE INVENTION

An adapter of the present invention is an adapter to be attached to a memory card for changing an external shape such that it can be inserted into a memory card insertion section of specific type equipment, comprising: an adapter body for defining a space housing the memory card; a write protect mechanism including a write enable/disable setting member which is slidable with respect to the adapter body; and a terminal portion located in the adapter body, which is formed so as to be electrically connected to a terminal portion of the memory card when the memory card is housed in the adapter body, wherein the write protect mechanism sets whether to enable or disable writing of data into the memory card in accordance with the position of the write enable/disable setting member, thereby achieving the above-described objective.

A notch portion may be formed on a side surface of the adapter body; the write enable/disable setting member may be arranged such that either a first position or a second position is selected; a part of the write enable/disable setting member may cover a part of the notch portion at the first position; and the part of the write enable/disable setting member may cover the other part of the notch portion at the second position.

The write protect mechanism may be formed so as to protrude from a side surface on one side of the adapter body to an inner space of the adapter body.

A terminal portion of the memory card may include N terminals; a terminal portion of the adapter may include M terminals which is less than N; and the terminal portion of the adapter may be formed such that the predetermined M terminals among N terminals included in the terminal portion of the memory card respectively contact with the M terminals included in the terminal portion of the adapter when the memory card is housed in the adapter body.

A step portion may be provided in the adapter body, and the step portion may be formed enabling it to fit onto a guide provided on at least a part of side surfaces on both sides of the memory card.

The adapter body may be formed such that a part of the memory card is exposed from the adapter body when the memory card is housed in the adapter body.

A memory card of the present invention is a memory card structured enabling it to be housed in an adapter, wherein: the adapter has an adapter body for defining a space for housing the memory card and a write protect mechanism for setting whether to enable or disable writing of data into the memory card; the write protect mechanism is formed so as to protrude from a side surface on one side of the adapter body into an inner space of the adapter body; the memory card comprises a memory portion to which data can be written, and a terminal portion electrically connected to the memory portion; and a notch portion is formed on a side surface on one side of the memory card so as to conform to a shape of the write protect mechanism of the adapter, thereby achieving the above-described objective.

A guide may be formed in at least a part of side surfaces on both sides of the memory card, and the guide may be formed enabling it to fit onto a step portion formed inside the adapter body.

A projecting portion maybe provided in at least part of at least one of inner side surfaces of the adapter body, and at least one of the side surfaces on both sides of the memory card may be formed enabling it to fit onto the projecting portion.

The adapter body may be formed such that a part of the memory card is exposed from the adapter body when the memory card is housed in the adapter body, and a groove may be formed in a part of the memory card which is exposed.

A memory card module of the present invention is a memory card module comprising: an adapter to be attached to a memory card for changing an external shape such that it can be inserted into a memory card insertion section of specific type equipment; and the memory card, wherein: the adapter comprises an adapter body for defining a space for housing the memory card, a write protect mechanism including a write enable/disable setting member which is slidable with respect to the adapter body, and a terminal portion located in the adapter body, which is formed so as to be electrically connected to a terminal portion of the memory card when the memory card is housed in the adapter body; the write protect mechanism sets whether to enable or disable writing data into the memory card in accordance with the position of the write enable/disable setting member; the memory card housed in the adapter body comprises a memory portion to which data can be written, and a terminal portion electrically connected to the memory portion; and a notch portion is formed on a side surface on one side of the memory card so as to conform to a shape of the write protect mechanism of the adapter, thereby achieving the above-described objective.

BRIEF DESCRIPTION OF THE DRAWINGS

FIG. 2 shows a cross-section of the adapter 100 and a memory card 200;

FIG. 6A shows a front view of a memory card 200 according to the embodiment of the present invention;

FIG. 6B shows a side surface on the contact terminal side of the memory card 200 according to the embodiment of the present invention;

FIG. 6C shows a side surface on the side opposite to the contact terminal of the memory card 200 according to the embodiment of the present invention;

FIG. 6D shows a left-hand side surface of the memory card 200 according to the embodiment of the present invention;

FIG. 6E shows a right-hand side surface of the memory card 200 according to the embodiment of the present invention;

FIG. 11 is an enlargement view of a circled portion E shown in FIG. 10B; and

BEST MODE FOR CARRYING OUT THE INVENTION

Hereinafter, the embodiments of the present invention will be described with reference to the drawings.

1. Adapter

Figure 1A:
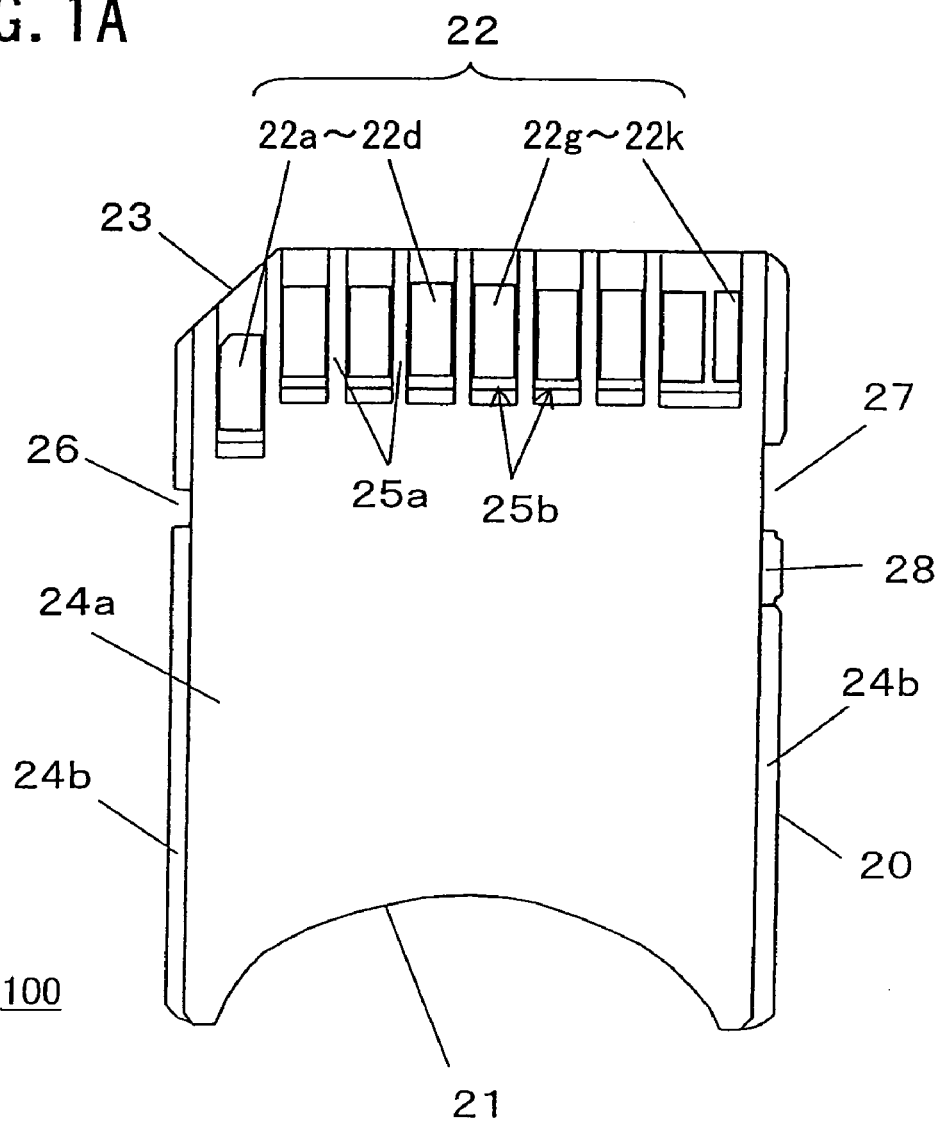
FIG. 1A shows a structure of an adapter 100 according to the embodiment of the present invention.

FIG. 1A shows a structure of an adapter 100 according to the embodiment of the present invention. The adapter 100 attaches to a memory card 200 of the present invention for changing an external shape such that the memory card 200 can be inserted into a memory card insertion section of equipment adapted to a conventional memory card 400. The details of the memory card 200 of the present invention will be described below.

The adapter 100 includes an adapter body 20, a contact terminal 22, and a write enable/disable setting member 28 included in a write protect mechanism.

On a side surface of the adapter body 20, a notch portion 23 is formed. The notch portion 23 is formed, so that the adapter 100 can be prevented from being erroneously inserted into a memory card insertion section of the equipment adapted to a memory card 400.

In the adapter body 20, a notch portion 21, a projecting portion 24a, step portions 24b, a plurality of rib portions 25a, a recessed portion 26, and a notch portion 27 are further formed.

The notch portion 21 is formed so that a part of the memory card 200 is exposed from the adapter body 20 when the memory card 200 is housed in the adapter body 20.

The projecting portion 24a has a width slightly smaller than the adapter body 20 and has a thickness greater than the adapter body 20. The step portions 24b are formed on side surfaces on both side of the adapter body 20. Each of the step portions 24b has thickness D. The step portions 24b are formed so as to fit onto step portions formed inside a memory card insertion section of the equipment adapted to the memory card 400. When the adapter 100 is inserted into a memory card insertion section of the equipment adapted to the memory card 400, the step portions 24b are guided with step portions formed inside a memory card insertion section of the equipment adapted to the conventional memory card 400. Between the plurality of the rib portions 25a, a plurality of slits 25b are formed.

The recessed portion 26 is formed on a side surface on one side of the adapter body 20 enabling it to fit onto a projecting portion formed inside a memory card insertion section of the equipment adapted to a memory card 400. Since the recessed portion 26 fits onto the projecting portion, the adapter 100 is prevented from being easily detached from the memory card insertion section of the equipment adapted to a memory card 400.

The notch portion 27 is formed on a side surface on one side of the adapter body 20. The notch portion 27 is formed on the side surface opposite to the side surface having the recessed portion 26 formed thereon.

The write enable/disable setting member 28 is fitted into the notch portion 27 so as to be slidable with respect to the adapter body 20. An external surface of the write enable/disable setting member 28 is formed substantially coplanar to an external surface of the adapter body 20. The details of the write protect mechanism including the write enable/disable setting member 28 will be described below.

The contact terminal 22 is located on the adapter body 20. The contact terminal 22 is formed so as to be electrically connected to a terminal portion of the equipment adapted to the memory card 400 when the adapter 100 is inserted into a memory card insertion section of the equipment adapted to the memory card 400. The contact terminal 22 is exposed to the outside of the adapter 100 from spaces between the plurality of slits 25b. The contact terminal 22 includes nine terminals (terminals 22a through 22d and terminals 22g through 22k). The details of the nine terminals (terminals 22a through 22d and terminals 22g through 22k) will be described below.

An external shape of the adapter 100 is substantially the same as the external shape of the memory card 400 except for the notch portion 21.

Figure 1B:
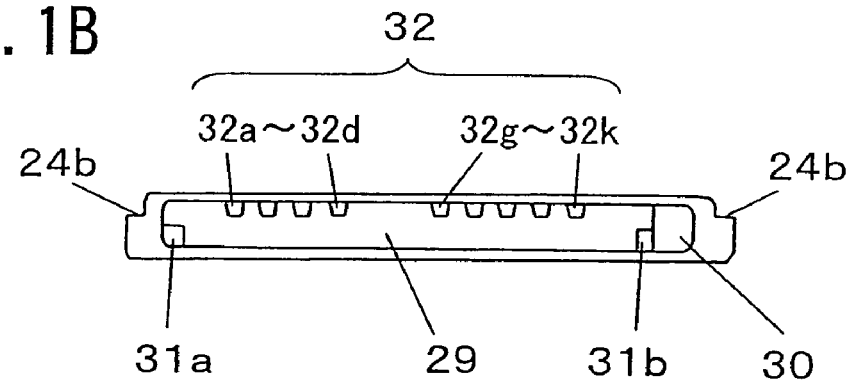
FIG. 1B shows the inside of an adapter body 20.

FIG. 1B shows the inside of the adapter body 20.

A housing section 29 is a space for housing the memory card 200 defined by the adapter body 20. The housing section 29 is a space which conforms to the external shape of the memory card 200.

Inside the adapter body 20, a protruding portion 30, a step portion 31a, a step portion 31b, and a contact terminal 32 are provided.

The protruding portion 30 shows a write protect mechanism formed so as to protrude from a side surface on one side of the adapter body 20 into an inner space of the adapter body 20. The step portions 31a and 31b are formed so as to enable them to fit onto guides provided on a memory card.

The contact terminal 32 includes nine terminals (terminals 32a through 32d and terminals 32g through 32k). The details of the nine terminals (terminals 32a through 32d and terminals 32g through 32k) will be described below.

FIG. 2 shows a cross-section of the adapter 100 and the memory card 200.

The contact terminal 22 is formed similarly to the contact terminal 42 included in the memory card 400. When the adapter 100 is inserted into a memory card insertion section of equipment adapted to a memory card 400, the contact terminal 22 is electrically connected to a terminal portion of the equipment adapted to the memory card 400. The contact terminal 22 includes nine terminals (terminals 22a through 22d and terminals 22g through 22k).

When the memory card 200 is inserted into the adapter body 20, the contact terminal 32 is electrically connected to a contact terminal 5 included in the memory card 200. The contact terminal 5 includes eleven terminals (5a through 5k). The contact terminal 32 includes nine terminals (terminals 32a through 32d and terminals 32g through 32k). The interval between the nine terminals (terminals 32a through 32d and terminals 32g through 32k) are set such that the terminals 32a through 32d and terminals 32g through 32k can be connected to the nine terminals other than terminals 5e and 5f (terminals 5a through 5d and terminals 5g through 5k).

The terminal 32a serves as one end of a metal terminal and terminal 22a serves as the other end of the terminal. Similarly, terminal 32x serves as one end of a terminal and terminal 22x serves as the other end of the terminal (herein, x=b, c, d, g, h, i, j, or k).

The number of terminals included in the terminal portion of the memory card 200 is not limited to eleven, and the number of terminals included in the terminal portion of the adapter 100 is not limited to nine. As long as the terminal portion of the adapter is formed such that a predetermined M terminals among N terminals included in the terminal portion of the memory card respectively contact with M terminals included in the terminal portion of the adapter when the memory card is housed in the adapter body, the terminal portion of the memory card may include N terminals and the terminal portion of the adapter may include M terminals which is less than N.

When the memory card 200 is inserted into the adapter body 20 and the adapter 100 is inserted into a memory card insertion section of the equipment adapted to the memory card 400, the contact terminal 5 included in the memory card 200 is connected to the terminal portion of the equipment adapted to the memory card 400 via such metal terminals without requiring a special conversion circuit or the like.

The adapter 100 may include elastic metal fittings 39. The metal fittings 39 are fitted into a side surface of the adapter body 20 so as to engage to a recessed portion 10a of the memory card 200. The details of the recessed portion 10a of the memory card 200 will be described below.

Figure 3:
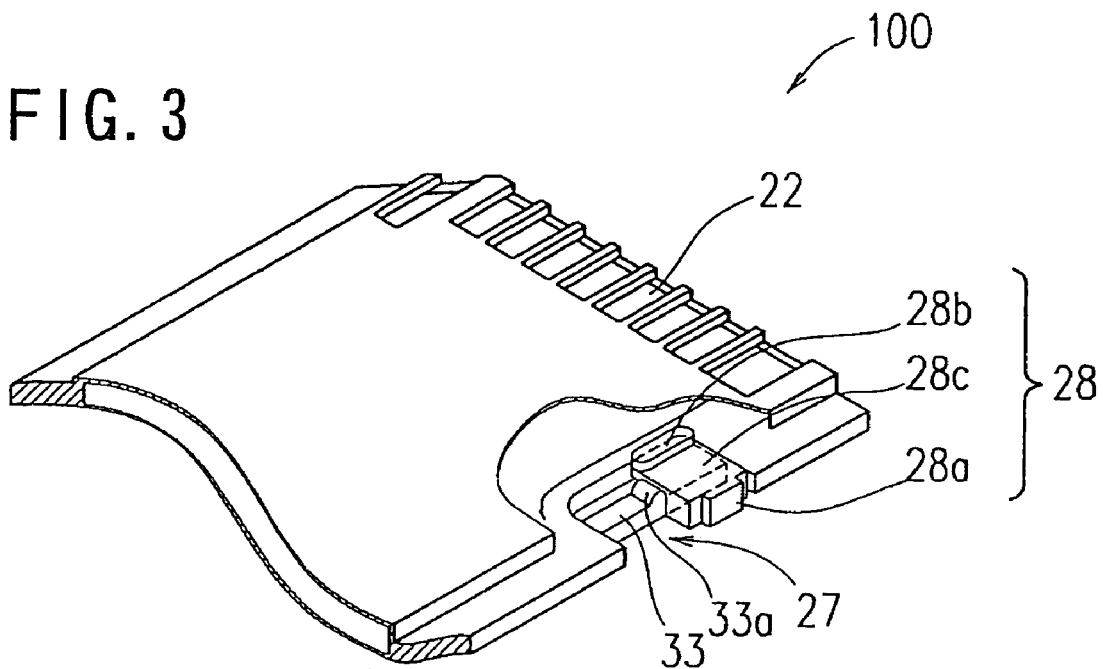
FIG. 3 shows the details of a write protect mechanism including a write enable/disable setting member 28.

FIG. 3 shows the details of the write protect mechanism including the write enable/disable setting member 28.

The write enable/disable setting member 28 which is slidable with respect to the adapter body 20 is formed of an operation portion 28a, a detachment prevention portion 28b and a slidable contact portion 28c. The operation portion 28a is a slidable switch for manually sliding the write enable/disable setting member 28. The slidable contact portion 28c connects the operation portion 28a and the detachment prevention portion 28b and also contacts and slides with respect to an elastic guide 33. On the elastic guide 33, a projecting portion 33a is formed.

Figure 4:
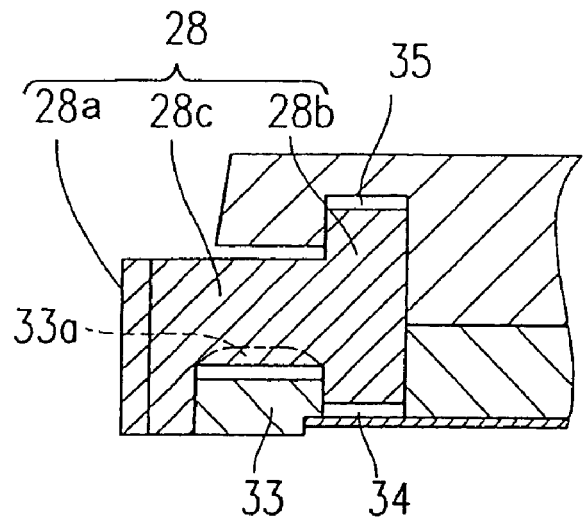
FIG. 4 shows a cross-section of the write protect mechanism including the write enable/disable setting member 28.

FIG. 4 shows a cross-section of the write protect mechanism including the write enable/disable setting member 28.

A groove 35 is formed in a lower portion 20a of the adapter body 20. A groove 34 is formed between an upper portion 20b of the adapter body 20 and the elastic guide 33. The detachment prevention portion 28b is fitted into the groove 34 and the groove 35 so as to be slidable.

In the elastic guide 33, a projecting portion 33a is formed at substantially the center of the elastic guide 33. The projecting portion 33a serves as an engagement portion to stop sliding of the write enable/disable setting member 28 with respect to the elastic guide 33. The slidable contact portion 28c slides over the projecting portion 33a and then is stopped at one side of the notch portion 27. The projecting portion 33a enables both creating a tactile feeling when the write enable/disable setting member 28 slides and stopping the write enable/disable setting member 28. The tactile feeling can be adjusted by varying the degree of a protuberance of the projecting portion 33a.

The write enable/disable setting member 28 is arranged such that it is selected to be in either the first position or the second position. At the first position, a part of the write enable/disable setting member 28 covers a part of the notch portion 27. At the second position, a part of the write enable/disable setting member 28 covers another part of the notch portion 27. An operation to change the position of the write enable/disable setting member 28 is performed by pinching the operation portion 28a with fingers and sliding the operation portion 28a right and left. The write protect mechanism sets whether to enable or disable writing of data into a semiconductor memory in accordance with the position of the write enable/disable setting member 28. The write protect mechanism can mechanically set whether to enable or disable writing of data into a memory card in accordance with the position of the write enable/disable setting member 28.

Figure 5A:
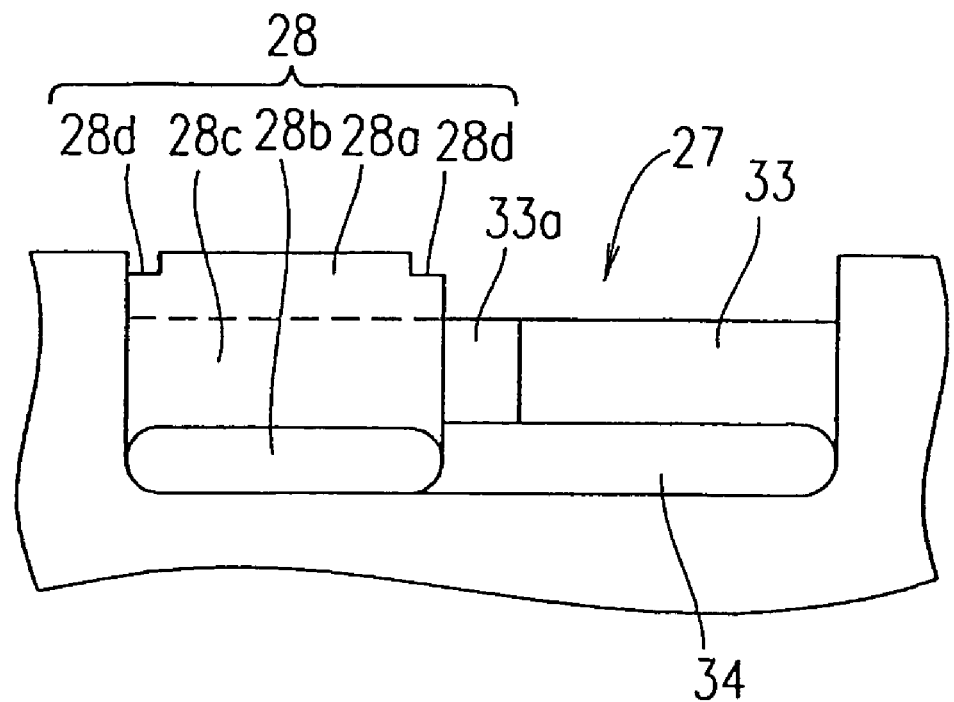
FIG. 5A shows the write enable/disable setting member 28 covering the left-hand side of a notch portion 27.

FIG. 5A shows the write enable/disable setting member 28 covering the left-hand side of the notch portion 27.

By sliding the write enable/disable setting member 28 to the left, the slidable contact portion 28c slides over the projecting portion 33a of the elastic guide 33. The write enable/disable setting member 28 covers the left-hand side of the notch portion 27.

Figure 5B:
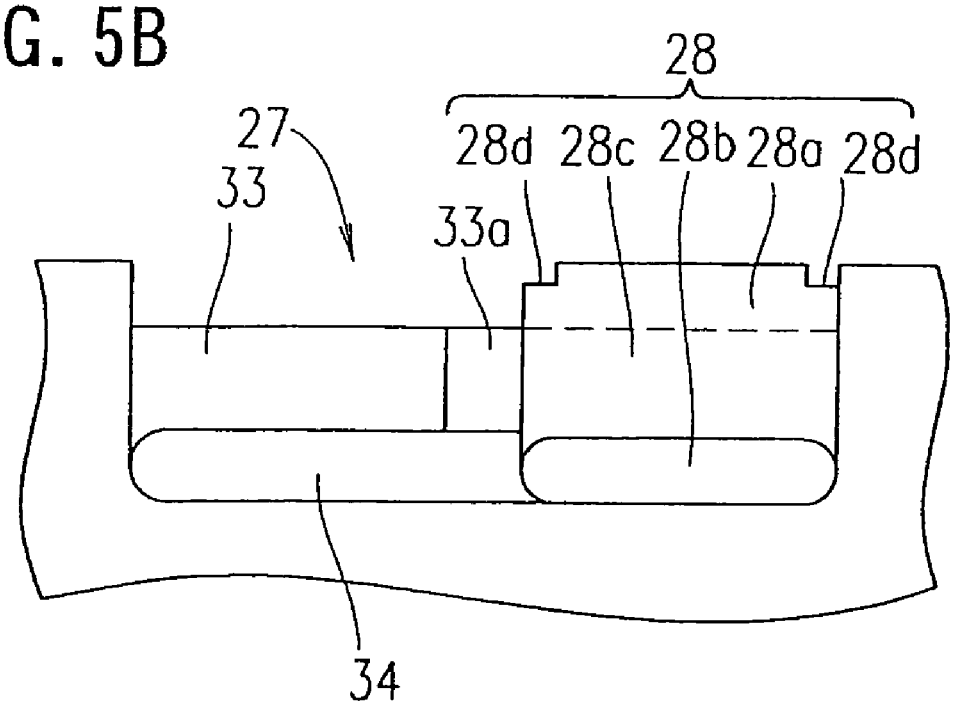
FIG. 5B shows the write enable/disable setting member 28 covering the right-hand side of the notch portion 27.

FIG. 5B shows the write enable/disable setting member 28 covering the right-hand side of the notch portion 27.

By sliding the write enable/disable setting member 28 to the right, the slidable contact portion 28c slides over the projecting portion 33a of the elastic guide 33. The write enable/disable setting member 28 covers the right-hand side of the notch portion 27.

By visually checking which side of the notch portion 27 is covered by the write enable/disable setting member 28, whether to enable or disable writing of data can be determined.

On both corners of the operation portion 28a, step portions 28d are formed. Thus, small recessed portions can be formed between the upper portion 20b of the adapter body 20 and the operation portion 28a. The small recessed portions allow the fingers or nails to readily hook them.

In an example shown in FIGS. 1A and 1B, the adapter body 20 serves as an "adapter body for defining a space for housing a memory card". The notch portion 27 and the write enable/disable setting member 28 serves as a "write protect mechanism including a write enable/disable setting member which is slidable with respect to the adapter body". The contact terminal 22 and the contact terminal 32 serve as a "terminal portion located on the adapter body, which is formed so as to be electrically connected to a terminal portion of a memory card when the memory card is housed in the adapter body". However, the adapter 100 is not limited to the example shown in FIGS. 1A and 1B. The adapter 100 may have any structure as long as it has the functions of each portion described above.

According to the adapter of the present invention, the write protect mechanism sets whether to enable or disable writing of data into a memory card in accordance with the position of the write enable/disable setting member. Therefore, whether to enable or disable writing of data into a memory card can be mechanically set. As a result, the external shape of a memory card can be changed without electrically setting whether to enable or disable writing of data into a memory card.

2. Memory Card

FIG. 6A shows a front view of the memory card 200 according to the embodiment of the present invention.

The memory card 200 includes a case 1 and the contact terminal 5. The case 1 includes a lower side case 2 and an upper side case 3 (see FIG. 8).

When the memory card 200 is inserted into predetermined equipment, the contact terminal 5 is electrically connected to a connection portion of the predetermined equipment. The contact terminal 5 includes eleven terminals (terminals 5a through 5k). The contact terminal 5 is provided near a front edge 1a of the memory card 200 and is located on a substrate 4 (see FIG. 8) which is slightly lower than a surface of a planar portion of the memory card 200. The contact terminal 5 is exposed at window portion 2a formed on a front side of the lower case 2.

Among the eleven terminals 5a through 5k, nine terminals other than the terminals 5e and 5f have similar functions as the contact terminal 42 of the memory card 400. The terminals 5e and 5f are terminals for adding functionality which the memory card 400 does not have.

The terminals 5e and 5f for adding functionality cooperate with the terminals 5a through 5d and the terminals 5g through 5k, and extension LSI 8 to perform operation to add functionality of the memory card 200 which will be described below.

On side surface of one side of the memory card 200, the notch portion 9 is formed so as to conform to the shape of the write protect mechanism of the adapter 100. The notch portion 9 is formed so that the front edge 1a is shorter than a rear edge 1b and the front edge 1a is biased to one side.

In the memory card 200, the notch portion 9, the recessed portion 10a, a recessed portion 10b, a guide 11a, a guide 11b and a groove 12 are formed.

The notch portion 9 may serve for detection of an erroneous insertion of the memory card 200. The notch portion 9 is formed at a front portion of the memory card 200. When the memory card 200 is attempted to be inserted into the adapter 100 in an opposite direction, corners of the front portion which does not have the notch portion 9 abut the protruding portion 30 formed inside the adapter body 20, and thus the memory card 200 cannot be inserted into the adapter 100 securely.

The recessed portions 10a and 10b are formed so as to be able to be engaged to the elastic metal fittings 39 having projecting portions formed on the inner side surface of the adapter body 20. The elastic metal fittings 39 are fitted into a side surface of the adapter body 20. When the memory card 200 is inserted inside the adapter body 20, corresponding recessed portion 10a or 10b is engaged with the elastic metal fittings 39 to maintain the insertion state.

The guides 11a and 11b are provided on side surfaces on both sides of the memory card 200 in the front portion. The guide 11a is formed enabling it to fit onto the step portion 31a formed inside the adapter body 20. The guide 11b is formed enabling it to fit onto the step portion 31b formed inside the adapter body 20. The guides 11a and 11b function to press the memory card 200 to the contact terminal 32 of the adapter 100.

When the memory card 200 is inserted into the adapter body 20, the guide 11a fits onto the step portion 31a and the guide 11b fits onto the step portion 31b. The memory card 200 is guided such that the contact terminal 5 securely contacts with the contact terminal 32.

The groove 12 is formed in a part of the memory card exposed from the adapter body 20 when the memory card 200 is housed in the adapter body 20. For example, the groove 12 is formed near the rear edge 1b and on a surface of the upper case 3 of the memory card 200.

When the memory card 200 is inserted into the adapter body 20, it is possible to hook the finger nails on the groove 12 for removing the memory card 200 from the adapter body 20.

A portion in which the notch portion 9 is formed is not limited to a front portion of the memory card 200. The notch portion 9 may be formed anywhere as long as it avoids the portion where the write protect mechanism is provided in the adapter 100.

A portion in which the guides 11a and 11b are provided is not limited to the front portion on the side surfaces on both sides of the memory card 200. The guides 11a and 11b may be provided in at least a part of the side surfaces on both sides of the memory card 200 as long as they function to press the memory card 200 to the contact terminal 32 of the adapter 100.

In the memory card of the present invention, a notch portion is formed on a side surface on one side of the memory card so as to conform to the write protect mechanism of the adapter. Therefore, the memory card of the present invention may be housed in the adapter so as to avoid the portion where the write protect mechanism is formed so as to protrude from the side surface on one side of the adapter body into an inner space of the adapter body.

As a result, the memory card of the present invention is housed in the adapter securely.

FIG. 6B shows a side surface on the contact terminal side of the memory card 200 according to the embodiment of the present invention. FIG. 6C shows a side surface on the side opposite to the contact terminal of the memory card 200 according to the embodiment of the present invention. FIG. 6D shows a left-hand side surface of the memory card 200 according to the embodiment of the present invention. FIG. 6E shows a right-hand side surface of the memory card 200 according to the embodiment of the present invention.

Figure 7:
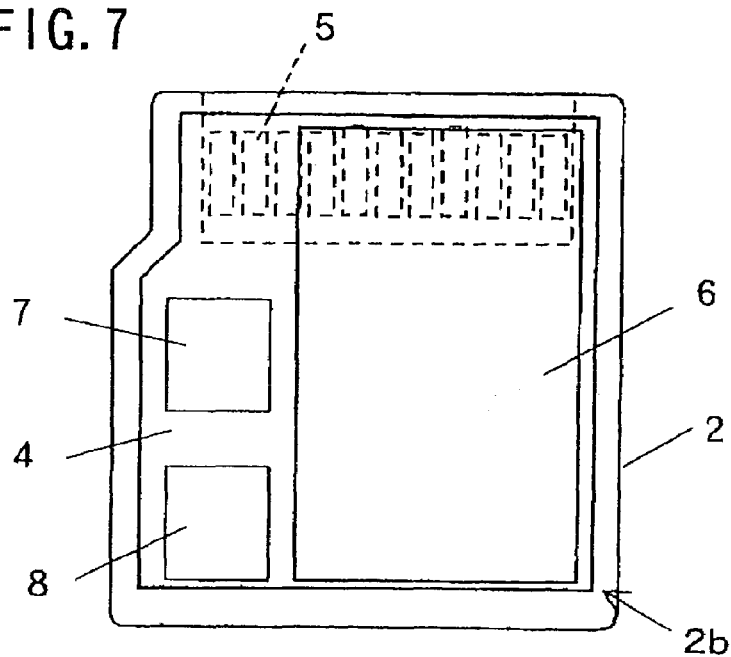
FIG. 7 shows an inner structure of the memory card 200.

FIG. 7 shows an inner structure of the memory card 200.

The memory card 200 further includes the substrate 4, a semiconductor memory 6 composed of a flash memory and so on, a controller LSI 7 of the memory card 200, and an extension LSI 8 including a functionality adding circuit. The contact terminal 5, the semiconductor memory 6, the controller LSI 7, and the extension LSI 8 are mounted on the substrate 4 by soldering or the like. The contact terminal 5, the semiconductor memory 6, the controller LSI 7, and the extension LSI 8 are connected to each other by wiring. The substrate 4 has a multilayer structure. As required by the circuit structure, other chip components are appropriately mounted.

Figure 8:
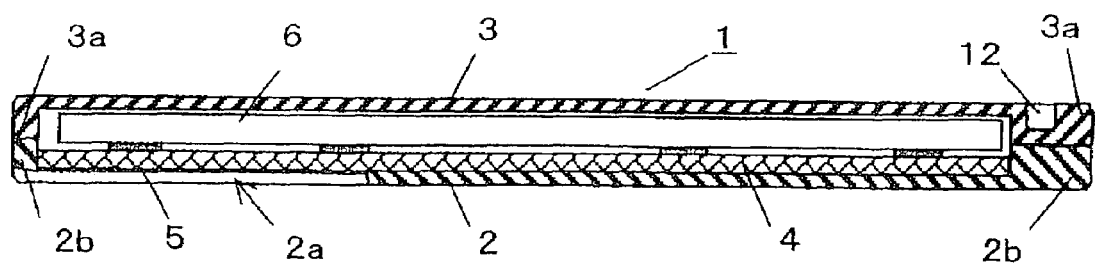
FIG. 8 shows a cross-sectional view of the memory card 200.

FIG. 8 shows a cross-sectional view of the memory card 200.

The lower case 2 and the upper case 3 form the case of the memory card 200. A side wall portion 2b having a projecting rib shape which is formed around the periphery of the lower case 2 and a side wall portion 3a having a projecting rib shape which is formed around the periphery of the upper case 3 are fixed with an adhesive or by welding. The substrate 4 is adhered on an inner surface of the lower case 2.

The contact terminal 5 located on the substrate 4, which is opposite to a surface on which the semiconductor memory 6 is mounted, is exposed at the window portion 2a formed in the lower case 2.

Figure 9:
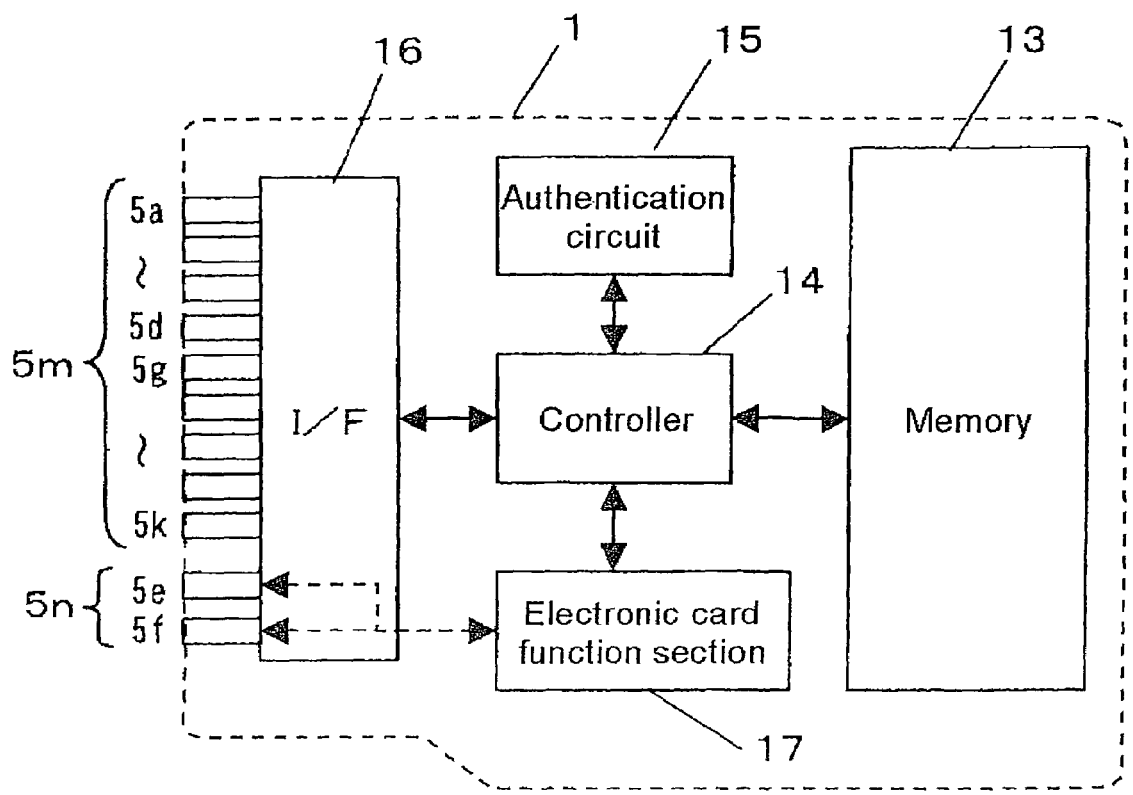
FIG. 9 shows a circuit structure of the memory card 200.

FIG. 9 shows a circuit structure of the memory card 200.

The memory card 200 further includes a memory 13, a controller 14, an authentication circuit 15, an interface circuit 16 and an electronic card function section 17.

The memory 13 is included in the semiconductor memory 6. The memory 13 includes a non-volatile data storage portion composed of a flash memory and so on, which can be read, written, and erased and can maintain stored contents when the power is shut off, and a storage portion which is randomly accessible.

The controller 14 is included in the controller LSI 7. The controller 14 performs control of accesses such as read, write, erase or the like to the data storage portion of the memory 13.

The authentication circuit 15 performs mutual authentication with the equipment to which the memory card is mounted via the controller 14 and notifies the controller 14 of the results.

The interface circuit 16 is located between the contact terminal 5 and the controller 14 and performs input and output of data and control signal.

The electronic card function section 17 performs electronic banking and the like. The controller 14 controls the electronic card function section 17.

The contact terminal 5 connected to the interface circuit 16 can be divided into terminal groups 5m and 5n. The terminal group 5n includes the functionality adding terminals 5e and 5f. The terminal group 5m includes the other nine terminals.

The terminal group 5m serves as a terminal having functions similar to a specific memory card. The controller 14 permits the equipment to access an authentication area in the memory 13 based on mutual authentication by the authentication circuit 15.

The memory card 200 has functions as a semiconductor memory card preferable for protection of copyright of data. The structure and the functions of the memory card 200 are similar to those of the memory card 400.

The memory card 200 has an electronic card function as a functionality adding function in addition to the functions of the memory card 400 with the electronic card function section 17 and the terminal group 5n.

Providing the functionality adding terminals 5e and 5f enables input and output of unique information as an interface for the electronic card function section 17. One of such functions is a non-contact electronic card function. With such a structure, a function which enables storage, reading, authentication and the like of information without providing a power supply to the memory card 1 is possible.

For example, when the memory card 200 is used for off-site electronic card banking, objects to be connected to the functionality adding terminals 5e and 5f of the terminal group 5n are equipment with the memory card 200 mounted thereto, a coupler provided in a holder, or an antenna. A data signal generated at the host equipment end is received by the coupler or the antenna. The necessary information is received by the electronic card function section 17 from the received signal, and the necessary information is processed. The coupler or antenna transmits/receives data signals between the host equipment end and the memory card 200 without direct contact.

The electronic card function section 17 is provided on the memory card 200, and data signals are transmitted/received via the terminal group 5m. With such structure, the memory card 200 has contact-type electronic card functions. By controlling the electronic card function section 17 by the controller 14 and inputting/outputting data via the terminal group 5m so that the memory card 200 has multifunction or combined function, the memory card 200 can address an added functionality by the electronic card function section 17.

In embodiments shown in FIGS. 6A and 7, the semiconductor memory 6 included in the memory card 200 which may be inserted into predetermined equipment and used serves as a "memory section to which data can be written". The contact terminal 5 serves as a "terminal portion electrically connected to the memory section". The notch portion 9 serves as a "notch portion formed so as to conform to the shape of the write protect mechanism of the adapter". However, the memory card 200 is not limited to that shown in FIGS. 6A and 7. The memory card 200 may have any structure as long as it has the functions of each part as described above.

3. Memory Card Module

Figure 10A:
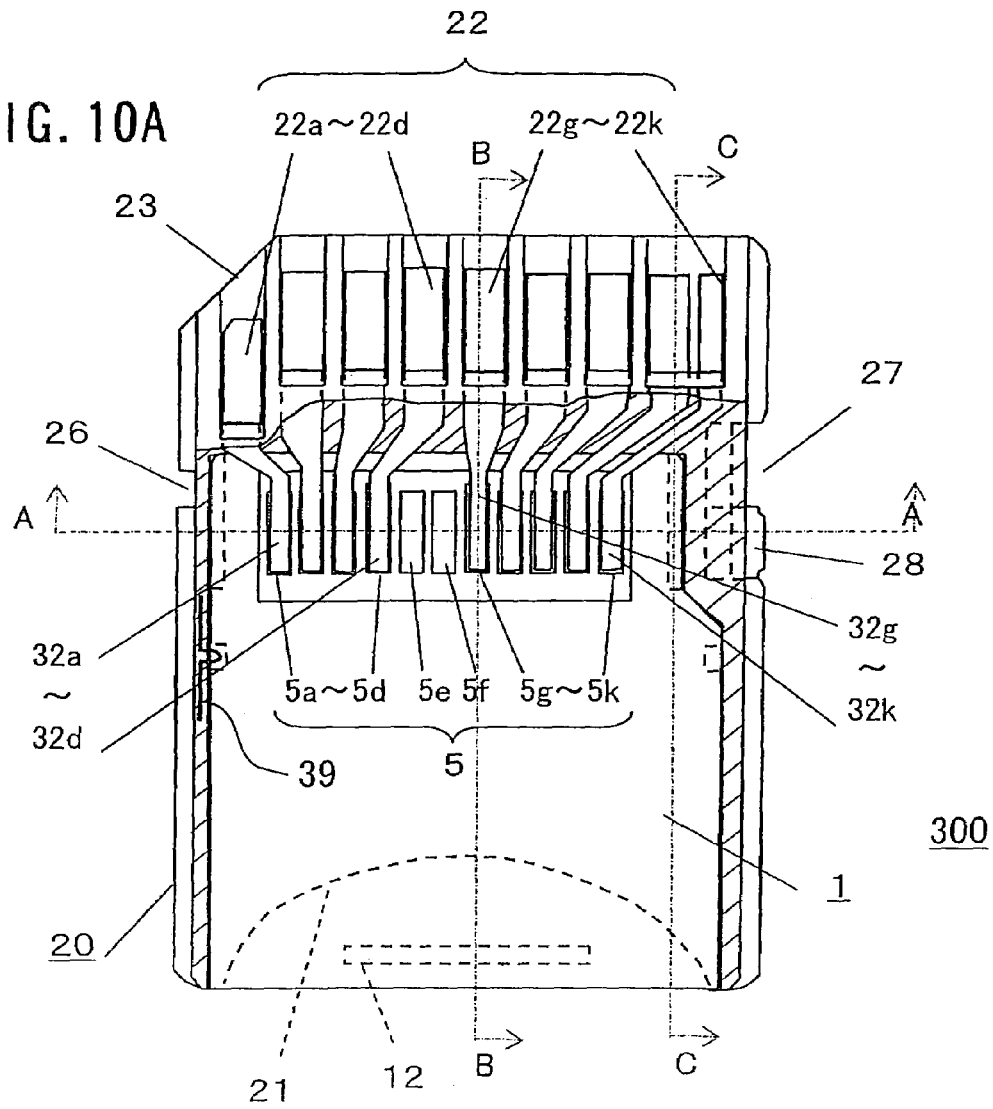
FIG. 10A shows a structure of a memory card module 300 including the adapter 100 and the memory card 200.

FIG. 10A shows a structure of a memory card module 300 including the adapter 100 and the memory card 200.

Figure 10B:
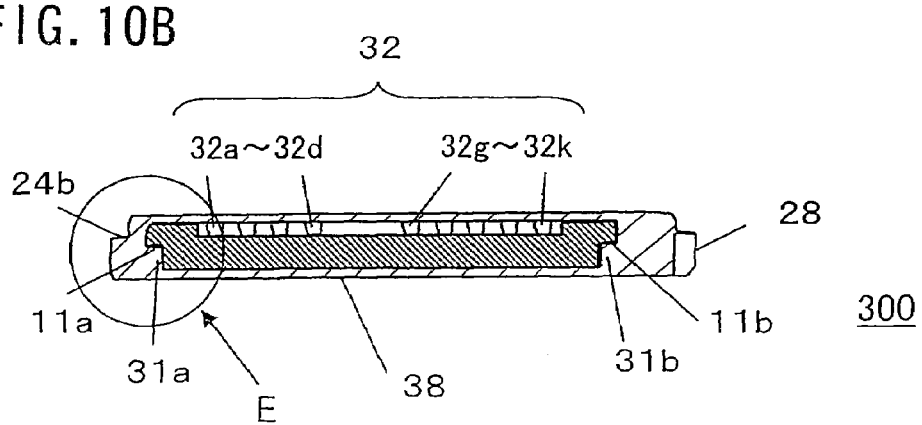
FIG. 10B shows an A-A cross section along line A-A shown in FIG. 10A.
Figure 10C:
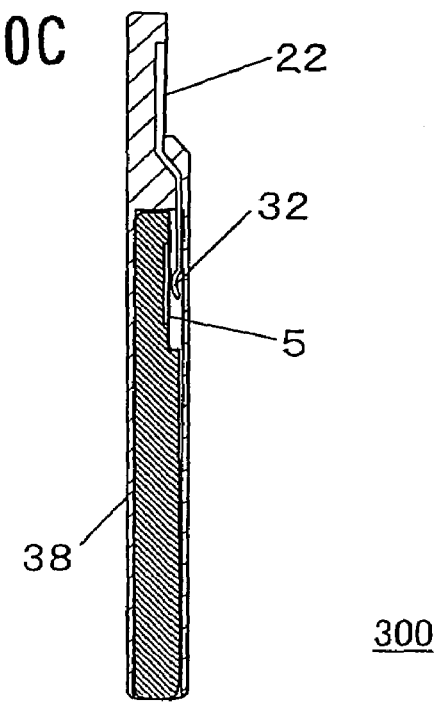
FIG. 10C shows a B-B cross section along line B-B shown in FIG. 10A.
Figure 10D:
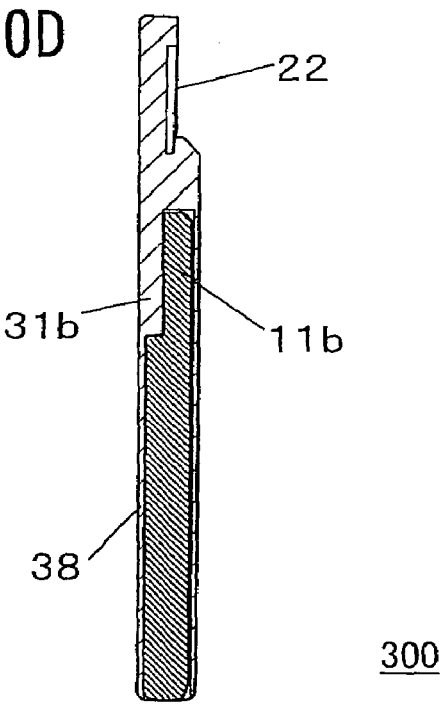
FIG. 10D shows a C-C cross section along line C-C shown in FIG. 10A.
Figure 12:
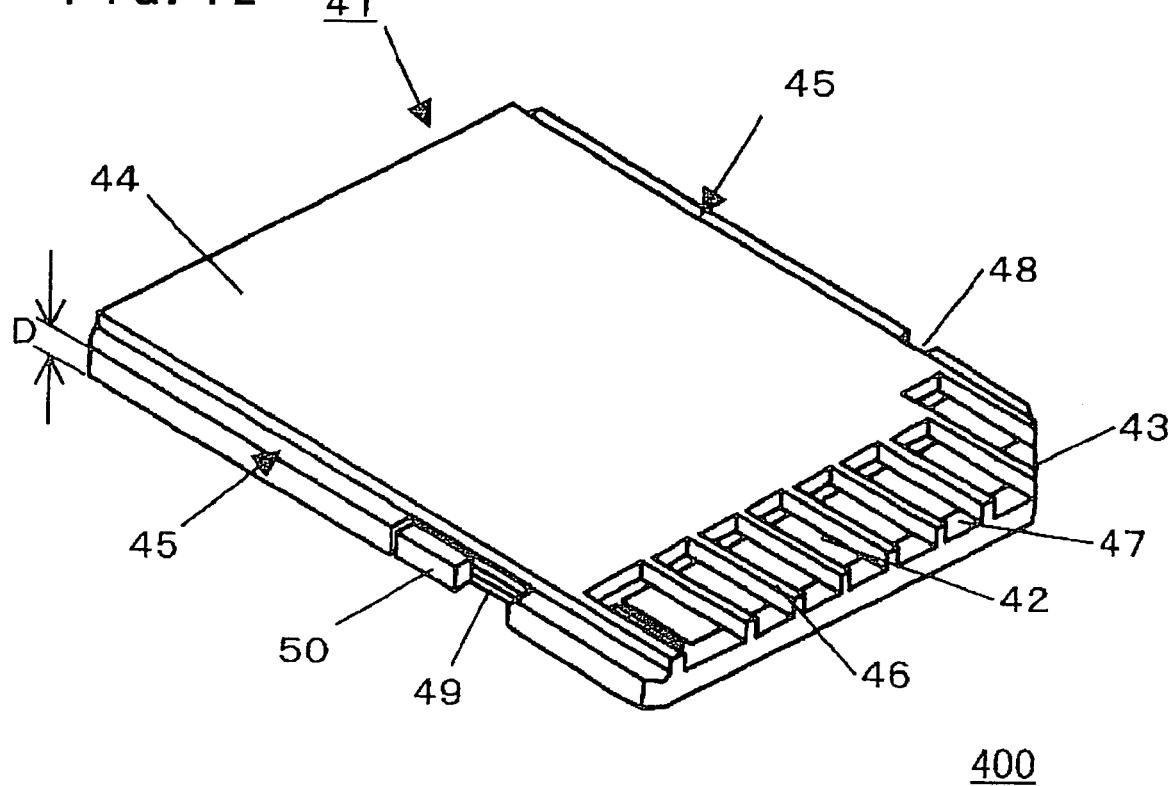
FIG. 12 shows a structure of a conventional memory card 400.

FIG. 10B shows an A-A cross section along line A-A shown in FIG. 10A. FIG. 10C shows a B-B cross section along line B-B shown in FIG. 10A. FIG. 10D shows a C-C cross section along line C-C shown in FIG. 10A.

When the memory card 200 is inserted into the adapter body 20, the memory card 200 is inserted from the insertion section of the housing portion 29 to reach the inner edge of the housing portion 29. Thus, the adapter 100 and the memory card 200 are integral. When the memory card 200 is inserted into the adapter body 20, it can be inserted into a memory card insertion section of the equipment adapted to the memory card 400. It is also possible to input/output data.

When the memory card module 300 is used, even though the memory card 200 has the functionality adding terminals 5e and 5f, the memory card 200 can perform similar functions and operations as those of the memory card 400 by utilizing terminals other than the functionality adding terminals 5e and 5f of the memory card 200. The functionality adding portion will not be affected in this case, and it is not necessary to provide a conversion circuit or the like in the adapter body 20. In this way, the memory card 200 and the memory card 400 are compatible.

When the memory card 200 is inserted into the adapter body 20, the groove 12 formed near the rear edge of the memory card 200 is exposed from the notch portion 21 formed in an inlet edge portion of the housing portion 29. Therefore, the memory card 200 can be easily removed from the adapter body 20.

As described above, the adapter 100 may include elastic metal fittings 39. The elastic metal fittings 39 are fitted into a side surface of the adapter body 20 so as to engage the recessed portion 10a of the memory card 200.

In the case where the memory card 200 is used by itself, it will be a memory card which is always rewritable. However, in the case where the memory card module 300 is used, it is possible to set to a state which disables writing by sliding the write enable/disable setting member 28 thereby setting whether to enable or disable writing. In the case where the memory card module 300 is inserted into the memory card insertion section of the equipment adapted to the memory card 400, data written into the memory card 200 can be protected readily and securely.

The details of (1) the adapter, (2) the memory card, and (3) the memory card module are described above.

Hereinafter, a gap between the adapter body 20 and the memory card 200 will be described.

FIG. 11 is an enlargement view of the circled portion E shown in FIG. 10B.

In FIG. 11, length A indicating the thickness of the adapter body 20 is 2.1 mm, length A1 indicating the thickness of the step portion of the adapter body 20 is 1.4 mm, length A2 indicating the thickness of the projecting portion of the adapter body 20 is 0.7 mm, length B indicating the thickness of the memory card 200 is 1.4 mm, length D1 indicating the thickness of a lower wall surface 37 of the adapter body 20 is 0.2 mm, length D2 indicating the thickness of an upper wall surface 38 of the adapter body 20 is 0.2 mm, length H1 indicating a gap between the inner surface of the lower wall surface 37 of the adapter body 20 and the memory card 200 is 0.2 to 1.5 mm, and length H2 indicating a gap between the inner surface of the upper wall surface 38 of the adapter body 20 and the memory card 200 is 0.1 to 1.5 mm.

In the case where the guide 11a is not formed in the memory card 200, the memory card 200 is pressed by the terminal 32 with a pressure P1 and the upper wall surface 38 is pressed against the memory card 200. Thus, the upper wall surface 38 having a thickness of length D2 may deform. As a result, a problem that a normal contact pressure of the terminal 32 cannot be maintained occurs.

In the case where the guide 11a is formed in the memory card 200, even when the contact pressure P1 of the contact terminal 32 is applied to the memory card 200, the memory card 200 does not press the upper wall surface 38. This is because the guide 11a of the memory card 200 is supported by the step portion 31a of the adapter body 20 and the length H2 is maintained. Thus, the deformation of the upper wall surface 38 can be prevented. As a result, a normal contact pressure of the terminal 32 can also be maintained.

The requirement for the step portion 11a of the memory card 200 to be supported by the step portion 31a of the adapter body 20 is that the difference (A−B) between the length B indicating the thickness of the memory card 200 and the length A indicating the thickness of the adapter body 20 and the length (D1+D2) indicating total thickness of both planar portions of adapter case are in the following relationship:

$$(A-B)-(D1+D2)=H1+H2.$$

The length H1 may be the same as the length H2. Further, the length D1 and the length D2 may vary. The length A, length A1, length A2 and length B are predetermined based on specification of a memory card, and cannot be varied.

The present invention has been illustrated by using the preferable embodiments of the present invention. However, the present invention should not be construed with limitation to such embodiments. It is understood that the scope of the present invention should be construed only from the claims. It is understood that, based on the descriptions regarding the specific preferable embodiments, those skilled in the art can carry out the scope of the descriptions as described herein and also the scope equivalent thereto based on the common technical knowledge. It is understood that the patents, patent applications, and other documents cited herein should be herein incorporated as a reference as if the contents thereof are specifically described herein.

INDUSTRIAL APPLICABILITY

According to the adapter of the present invention, a write protect mechanism set whether to enable or disable writing of data into a memory card in accordance with a position of a write enable/disable setting member. Thus, it is possible to mechanically set whether to enable or disable writing of data into a memory card. As a result, the external shape of a memory card can be changed without electrically setting whether to enable or disable writing of data into a memory card.

According to the memory card of the present invention, a notch portion is formed so as to conform to a shape of a write protect mechanism of an adapter on a side surface on one side of the memory card. Thus, the memory card of the present invention can be housed in the adapter so as to avoid the portion where the write protect mechanism is formed so as to protrude from a side surface on one side of an adapter body into an inner space of the adapter body. When the memory card of the present invention is attempted to be inserted in an opposite direction, the memory card cannot avoid the portion where the write protect mechanism is provided. Thus, it is possible to prevent the memory card from being erroneously inserted into the adapter.

The invention claimed is:

1. An adapter to be attached to a memory card for changing an external shape such that it can be inserted into a memory card insertion section of specific type equipment, comprising:
    an adapter body for defining a space housing the memory card;
    a write protect mechanism including a write enable/disable setting member which is slidable with respect to the adapter body; and
    a terminal portion located in the adapter body, which is formed so as to be electrically connected to a terminal portion of the memory card for the input and output of data when the memory card is housed in the adapter body and electrically connected to a terminal portion of the memory card insertion section when the adapter is inserted into the memory card insertion section,
    wherein the write protect mechanism sets whether to enable or disable writing of data into the memory card in accordance with the position of the write enable/disable setting member;
    a notch portion is formed on a side surface on one side of the memory card so as to conform to a shape of the write protect mechanism of the adapter.

2. An adapter according to claim 1, wherein:
    a notch portion is formed on a side surface of the adapter body;
    the write enable/disable setting member is arranged such that either a first position or a second position is selected;
    a part of the write enable/disable setting member covers a part of the notch portion at the first position; and
    the part of the write enable/disable setting member covers the other part of the notch portion at the second position.

3. An adapter according to claim 1, wherein the write protect mechanism is formed so as to protrude from a side surface on one side of the adapter body to an inner space of the adapter body.

4. An adapter according to claim 1, wherein:
    a terminal portion of the memory card includes N terminals;
    a terminal portion of the adapter includes M terminals which is less than N; and
    the terminal portion of the adapter is formed such that the predetermined M terminals among N terminals included in the terminal portion of the memory card respectively contact with the M terminals included in the terminal portion of the adapter when the memory card is housed in the adapter body.

5. An adapter according to claim 1, wherein a step portion is provided in the adapter body, and the step portion is formed enabling it to fit onto a guide provided on at least a part of side surfaces on both sides of the memory card.

6. An adapter according to claim 1, wherein the adapter body is formed such that a part of the memory card is exposed from the adapter body when the memory card is housed in the adapter body.

7. An adapter according to claim 1, wherein:
    the terminal portion located in the adapter body electrically connects the memory card to the memory card insertion section of the specific type equipment.

8. A memory card structured enabling it to be housed in an adapter, wherein:
    the adapter has an adapter body for defining a space for housing the memory card and a write protect mechanism for setting whether to enable or disable writing of data into the memory card;
    the write protect mechanism is formed so as to protrude from a side surface on one side of the adapter body into an inner space of the adapter body;
    the memory card comprises
        a memory portion to which data can be written, and
        a terminal portion electrically connected to the memory portion; and
    a notch portion is formed on a side surface on one side of the memory card so as to conform to a shape of the write protect mechanism of the adapter.

9. A memory card according to claim 8, wherein a guide is formed in at least a part of side surfaces on both sides of the memory card, and the guide is formed enabling it to fit onto a step portion formed inside the adapter body.

10. A memory card according to claim 8, wherein a projecting portion is provided in at least part of at least one of inner side surfaces of the adapter body, and at least one of the side surfaces on both sides of the memory card is formed enabling it to fit onto the projecting portion.

11. A memory card according to claim 8, wherein the adapter body is formed such that a part of the memory card is exposed from the adapter body when the memory card is housed in the adapter body, and a groove is formed in a part of the memory card which is exposed.

12. A memory card module comprising: an adapter to be attached to a memory card for changing an external shape such that it can be inserted into a memory card insertion section of specific type equipment; and the memory card, wherein:

the adapter comprises an adapter body for defining a space for housing the memory card, a write protect mechanism including a write enable/disable setting member which is slidable with respect to the adapter body, and a terminal portion located in the adapter body, which is formed so as to be electrically connected to a terminal portion of the memory card when the memory card is housed in the adapter body;

the write protect mechanism sets whether to enable or disable writing data into the memory card in accordance with the position of the write enable/disable setting member;

the memory card housed in the adapter body comprises a memory portion to which data can be written, and a terminal portion electrically connected to the memory portion; and a notch portion is formed on a side surface on one side of the memory card so as to conform to a shape of the write protect mechanism of the adapter.

* * * * *